United States Patent
Greiser et al.

(10) Patent No.: US 8,299,790 B2
(45) Date of Patent: Oct. 30, 2012

(54) MAGNETIC RESONANCE METHOD CONTROL DEVICE AND SYSTEM FOR IMAGING A VOLUME SEGMENT OF A SUBJECT

(75) Inventors: Andreas Greiser, Erlangen (DE); Sven Zuehlsdorff, Chicago, IL (US)

(73) Assignees: Siemens Medical Solutions USA, Inc., Malvern, PA (US); Siemens Aktiengesellschaft, Munich (DE)

( * ) Notice: Subject to any disclaimer, the term of this patent is extended or adjusted under 35 U.S.C. 154(b) by 344 days.

(21) Appl. No.: 12/715,425

(22) Filed: Mar. 2, 2010

(65) Prior Publication Data
US 2010/0219831 A1    Sep. 2, 2010

(30) Foreign Application Priority Data
Mar. 2, 2009  (DE) .................. 10 2009 011 290

(51) Int. Cl.
*G01V 3/00*   (2006.01)
(52) U.S. Cl. ................... 324/309; 324/307; 324/318
(58) Field of Classification Search ........... 324/300–322; 600/410–435
See application file for complete search history.

(56) References Cited

U.S. PATENT DOCUMENTS

| | | | | |
|---|---|---|---|---|
| 4,843,322 A * | 6/1989 | Glover | ......................... | 324/309 |
| 5,167,232 A * | 12/1992 | Parker et al. | .................. | 600/419 |
| 5,225,779 A * | 7/1993 | Parker et al. | .................. | 324/306 |
| 5,786,693 A * | 7/1998 | Gullapalli et al. | ............ | 324/309 |
| 6,043,654 A * | 3/2000 | Liu et al. | ....................... | 324/309 |
| 6,564,080 B1 * | 5/2003 | Kimura | ......................... | 600/410 |
| 6,850,793 B1 * | 2/2005 | Miyazaki et al. | ............ | 600/410 |
| 7,230,424 B1 * | 6/2007 | Morrone | ....................... | 324/309 |
| 7,557,576 B1 * | 7/2009 | Morrone | ....................... | 324/314 |
| 8,049,498 B1 * | 11/2011 | Morrone | ....................... | 324/309 |

* cited by examiner

*Primary Examiner* — Dixomara Vargas
(74) *Attorney, Agent, or Firm* — Schiff Hardin LLP

(57) ABSTRACT

For imaging a volume segment by means of a magnetic resonance system, of the volume segment is transferred into a dynamic steady state relative to the magnetization by means of the magnetic resonance system. The following steps are repeatedly executed until the volume segment has been completely measured. The slice is excited by means of the magnetic resonance system. MR signals of the slice are read out. The slice is offset in an overlapping manner such that an overlap range is created by the slice before the offset and the slice after the offset, the overlap range being a predetermined percentile of both the slice before the offset and the slice after the offset.

20 Claims, 3 Drawing Sheets

MAGNETIC RESONANCE METHOD CONTROL DEVICE AND SYSTEM FOR IMAGING A VOLUME SEGMENT OF A SUBJECT

BACKGROUND OF THE INVENTION

1. Field of the Invention

The present invention concerns a method and a device in order to generate images of a volume segment using a magnetic resonance system.

2. Description of the Prior Art

At present, in cardio-MRT measurements for cine-imaging different slices are typically measured at different positions in succession, for example in order to arrive at a volumetric image coverage to determine the cardiac function. Cardio-MRT measurement thereby stands for cardiovascular measurements by means of a magnetic resonance tomograph (MRT). Cine-imaging as used herein means a series or multiple series of images that are generated quickly at different points in time and are shown as a type of movie. In other words: MR measurements of the heart are produced by means of cardio-MRT measurements in order to show a moving heart.

Three-dimensional methods exist for this purpose, but the image quality is, however, often not comparable with the image quality of two-dimensional methods due to the slice profiles and additional aliasing in the direction perpendicular to the slice. Moreover, the MR signal to be acquired is strongly saturated by the lingering volume excitation (in comparison to two-dimensional methods), which is reflected in a poor image contrast.

In the two-dimensional methods, a heart beat is typically brought into a dynamic equilibrium (steady state) relative to the magnetization along the magnetization within the scope of a type of initialization without MR signals being thereby measured or image data acquired, such that a change of the MR signal across k-space measured as a whole for an image no longer exhibits any significant signal fluctuations resulting from this in the actual imaging or MR measurement. If this initialization to engage the magnetization is omitted, for example in order to save the time of the heart beat, the first images exhibit corresponding artifacts, which negatively affects the quality of the imaging.

In strongly segmented measurements in which many measurements (for example 16) per slice are implemented, an additional heart beat for the initialization means no noteworthy time loss since a length of many heart beats (at least if only one measurement is conducted per heart beat) must be measured anyway for a complete measurement of a slice. Based on the developments of the last year, most of all in the field of parallel imaging, however, it is presently possible to collect all data or, respectively, MR signals necessary for a slice with a few segments, or even with only one segment (a single shot), with sufficient spatial and temporal resolution. Therefore, in the extreme case the additional heart beat leads to a reduction of the process efficiency of 50% in a real time imaging.

According to the prior art, it is accepted that an additional heart beat is necessary to allow the magnetization to take effect. Therefore, according to the prior art of the technique the minimum measurement duration of a slice is two heart beats if it is assumed that only one measurement can be implemented per heart beat. In a typical breath hold phase of 12 s, a maximum of six slices can thus be measured. For a measurement to evaluate the heart function, at least two breath hold phases are therefore necessary according to the prior art.

SUMMARY OF THE INVENTION

An object of the present invention is to implement the imaging of a volume segment such that the number of additional heart beats to engage the magnetization is optimally minimal.

The above object is achieved in accordance with the present invention by a method for imaging a volume segment by means of a magnetic resonance system, that includes the following steps.

A specific slice of the volume segment is transformed into a dynamic steady state (equilibrium) relative to the magnetization by means of the magnetic resonance system.

The following further steps are implemented repeatedly without the re-implementation of the step just described.

The predetermined slice is excited by means of the magnetic resonance system.

MR signals of the slice are read out. The entire k-space of the slice is read out in this step.

The slice is offset or shifted in order to determine the next slice so that a section region between the slice before the offset and the slice after the offset is created. This section region is a predetermined percentile (for example more than 50%) of both the slice before the offset and the slice after the offset.

After the offsetting of the slice, the method returns to the excitation step. The method ends when the entire volume segment has been measured.

The method according to the invention advantageously executes the step of transforming the slice into the dynamic steady state relative to the magnetization only a single time at the beginning of the method, and does not repeat this step during the following steps in which the entire volume segment is measured for imaging. In other words: the step of the transformation of the slice into the dynamic steady state relative to the magnetization is implemented only a single time to image the entire volume segment.

This omission of additional transformations of a slice of the volume segment into a dynamic steady state relative to the magnetization is possible since the respective new or next slice which is excited and read out differs only partially from the preceding slice.

The offsetting or shifting of the slice from the slice that is currently directly measured to the next slice that is to be measured thereby in particular ensues in the direction of the normal vector of the slice surface (i.e. perpendicular to the double-obliquely positioned current slice). The offsetting of the slice therefore effectively ensues in the direction of the slice thickness, wherein the slice is in particular not additionally shifted further in a direction perpendicular to the normal vector of the slice surface.

The percentile range or percentile which the slice after the offsetting exhibits together with the slice before the offsetting affects on the one hand the quality of the imaging (for example the contrast) and on the other hand the time span in which a specific volume segment can be measured. The greater the percentile range, thus the less that the slice after the offsetting differs from the slice before the offsetting, the higher the quality of the imaging since artifacts in particular occur due to the part of the slice which is still not contained in the slice before the offsetting or in the preceding slice. The time span in which a specific volume segment is measured is shorter the smaller the percentile range, since the slice after a measurement is shifted more significantly for the next measurement the smaller the percentile range.

So that too many artifacts do not occur, the percentile range should be greater than 50%. However, the percentile range can also be above 90% or even above 95% if, for example, more value is placed on the quality of the imaging than on the time duration of the implementation of the method.

In the method according to the invention, the first slice with which the method begins is in particular placed such that it is arranged at the edge of the volume segment. In other words, the first slice with which the method begins is in particular a first slice as viewed from the edge of the volume segment, such that overall the complete volume of interest is covered by the successive shifting of the slice positions.

The method according to the invention is particularly suitable for acquisitions of the heart so that the volume segment at least partially or completely comprises a heart of a patient.

The method according to the invention can be implemented within the scope of a real-time cine-measurement, for example.

Since the MR data exist in a quasi-continuously displaced z-t space, the MR signals of the slices can be processed and/or evaluated by means of a model-based ventricle analysis for imaging. What is thereby understood by a quasi-continuously displaced z-t space is a space which extends in the direction of the z-axis, wherein the z-axis is perpendicular to the respective slice or slice area or parallel to the normal vector of the slice area. The letter "t" stands for the time since different overlapping slices which are shifted in the z-direction are measured at different points in time.

The model-based ventricle analysis operates with a model of the beating or, respectively, moving heart. This model is adapted such that the adapted model corresponds as optimally as possible to the measurements (MR signals) acquired by the method according to the invention. The model-based ventricle analysis manages better with the manner of the determination of the MR data via overlapping slices according to the invention than with the conventional determination of the MR data in which the slices possess no overlap region. No jumps (discontinuities) exist in the volume segment to be acquired (which jumps can occur between the individual slices in the conventional method), such that the method according to the invention provides for a smoother coverage of the entire volume segment due to the model-based ventricle analysis, which is directly advantageous in the area of the heart valves.

Moreover, the visual evaluation of the data likewise turns out to be easier due to method according to the invention since the data are measured quasi-continuously in one pass, and do not have to be assessed slice for slice in cine-mode, as is typical according to the prior art.

An offset length by which the slice is offset between two successive readout processes can be determined by the following Equation (1):

$$\text{Offset length} = \text{Volume segment thickness} * \frac{\text{Readout time span}}{\text{Total measurement time}} \quad (1)$$

The offset length indicates a length or a displacement size by which the slice is shifted after the readout of the MR signals of the slice in order to then read out the MR signals of the displaced slice after an excitation of the displaced slice. The volume segment thickness describes the thickness or dimension of the volume segment in the displacement direction, i.e. in the direction of the normal vector of the slice area. The readout time span indicates what time span is required to read out the MR signals for the respective slice. This time span thereby comprises both the excitation of the respective slice by means of the magnetic resonance system and the readout of the MR signals. The total measurement time is a predetermined time duration (in which, for example, a patient must hold his breath) in order to measure all planned slices within the volume segment so that all necessary MR data for imaging of the entire volume segment are present.

If the volume segment exhibits a thickness of 10 cm, for example, 60 ms are required for the readout of the MR signals (read out time span) and 12 s are estimated for the total measurement duration, a length of 0.5 mm results for the offset length or slice shift per measurement. Given a typical slice thickness of 8 mm, a completely new slice is thus excited only after 16 chronological measurements. Or, expressed differently, the slice is shifted by 1/16 or 6% of its thickness after the readout of the MR signals, such that the percentile range of an overlap or of a slice range between two slices of successive measurements is approximately 94%. Since the new slice to be excited and measured accordingly comprises only 6% of new (not previously excited) volume, no significant artifacts are to be anticipated in the imaging, even if the transformation into the dynamic steady state relative to the magnetization only occurs at the beginning of the method.

It is noted that the slice thickness is not taken into account in Equation (1). Therefore the upper equation (1) in particular applies for the typical cases in which the slice thickness is small relative to the volume segment thickness.

The method according to the invention allows a cine-measurement in real time with a quasi-continuous slice displacement (after every individual image or, respectively, after every readout of the MR signals) with a suitable parameter selection (for example offset length, slice thickness) so that the entire volume of interest (the entire volume segment) is covered in a breath hold phase, and the slice displacement per image is small relative to the slice thickness. The evaluation of the data collected by the method according to the invention can thereby ensue via model-based algorithms (for example by a model-based ventricle analysis) or by a visual assessment.

The present invention also concerns a magnetic resonance system for the imaging of a volume segment. The device includes a control unit, a reception device and an evaluation device. The magnetic resonance system is correspondingly controlled with the control unit while the reception device serves to receive MR data of a predetermined slice within the volume segment that are acquired by the magnetic resonance system. The evaluation device is designed to evaluate these MR data. The device according to the invention is now designed such that it controls the magnetic resonance system by means of the control device such that the magnetic resonance system transforms a predetermined slice within the volume segment into a dynamic steady state relative the magnetization. The device subsequently executes the following steps until the volume segment is completely measured. The device again controls the magnetic resonance system by means of the control device such that the presently set slice is excited. The device subsequently reads out MR signals of the slice by means of the reception device. The slice is then offset by the device (for example by a fraction of a slice thickness) such that a slice region is created between the slice before the offsetting and the slice after the offsetting, which slice region comprises both a predetermined percentile (for example 90%) of the slice before the offsetting and of the slice after the offsetting.

The advantages of the device according to the invention essentially correspond to the advantages of the method according to the invention which have already been described in detail.

Furthermore, the present invention discloses a magnetic resonance system that includes a device according to the invention.

The software can be a source code (for example in C++) that must still be compiled and linked or that only must be interpreted, or it can be an executable software code that has only to be loaded into the corresponding computer for execution.

Finally, the present invention also concerns an electronically readable data medium (for example a DVD, a magnetic tape or a USB stick) on which electronically readable control information (in particular software; see above) is stored. When this control information (software) is read from the data medium and stored in a controller or computer of a magnetic resonance system, all embodiments of the method according to the invention that are described in the preceding can be implemented.

The present invention is in particular suitable for the implementation of cardio-MRT measurements. Naturally, the present invention is not limited to this preferred application field, but rather can in principle be used for imaging of an arbitrary volume segment within a body of an organism or even for imaging of a volume segment of an arbitrary (for example inanimate) volume.

DESCRIPTION OF THE PREFERRED EMBODIMENTS

Figure 1:
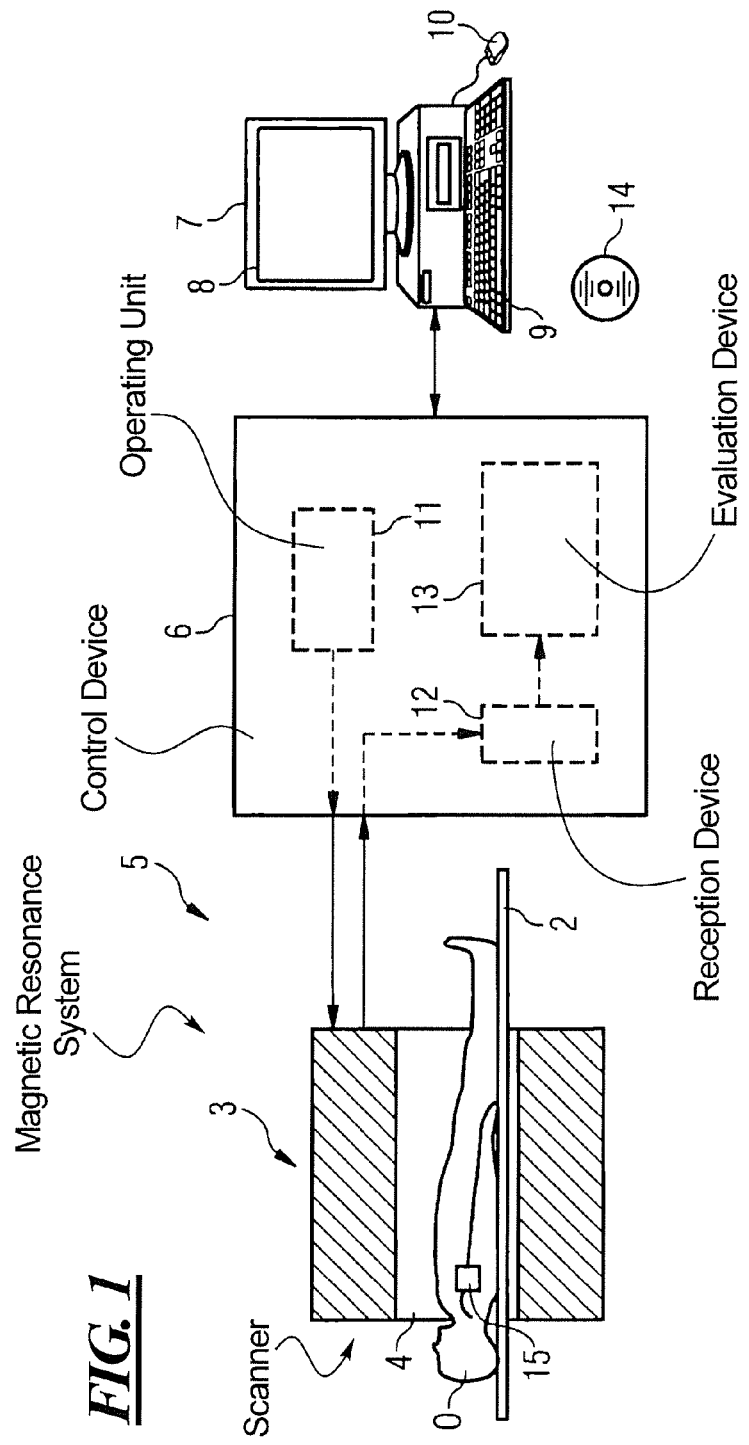
FIG. 1 schematically illustrates a magnetic resonance system according to the invention.

A magnetic resonance system 5 according to the invention is schematically shown in FIG. 1. The magnetic resonance system 5 essentially has a scanner 3 with which the magnetic field necessary for the MR examination is generated in a measurement space 4; a table 2; a control device 6 with which the scanner 3 is controlled and MR data from the scanner 3 are acquired; and a terminal 7 connected to the control device 6.

The control device 6 includes an operating unit 11; a reception device 12; and an evaluation device 13. During an MR examination MR data are received by the reception device 12 by means of the scanner 3, and the scanner 3 is controlled by the operating unit 11 such that MR data are acquired in a measurement volume 15 which is located inside the body of a patient O lying on the table 2.

The evaluation device 13 then prepares the MR data such that the data can be graphically presented on a screen 8 of the terminal 7, and such that images created according to the invention can be displayed. In addition to the graphical presentation of the MR data, a volume segment to be measured (for example) can be predetermined by a user with the terminal 7 (that has a keyboard 9 and a mouse 10 in addition to the screen 8) and additional specifications for implementation of the method according to the invention can be made. The software for the control device 6 can also be loaded into the control device 6 (in particular into the evaluation device 13) via the terminal 7. This software of the control device 6 can also embody the method according to the invention, and can likewise be stored on a DVD 14 so that this software can then be read by the terminal 7 from the DVD 14 and be copied to the control device 6.

Figure 2A:
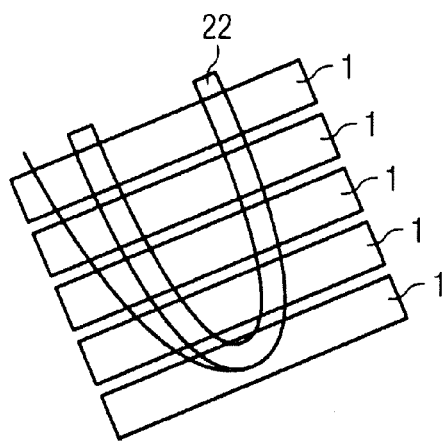
FIGS. 2a, 2b and 2c compare two conventional imaging methods to the method according to the invention.
Figure 2B:
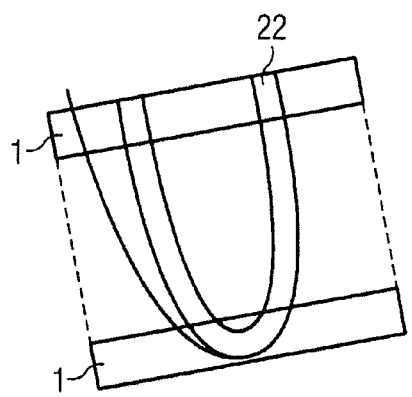
Figure 2C:
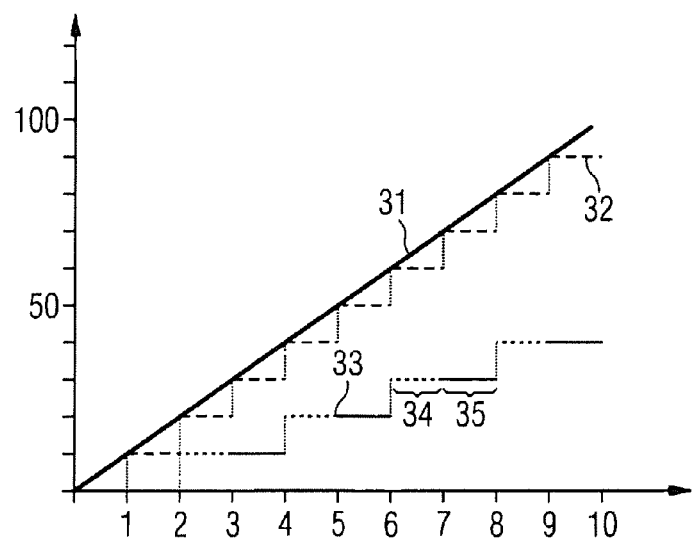

Two conventional methods 32, 33 for imaging of a volume segment which are shown in FIGS. 2a and 2c opposite a method 31 according to the invention which is schematically presented in FIGS. 2b and 2c.

A volume segment in the form of a cardiac chamber 22 is schematically presented in FIG. 2a. According to conventional methods 32, 33, the volume segment is subdivided into multiple slices 1 (five in the example) which are then excited independent of one another and read out in successive time intervals. In FIG. 2c it is shown at which heart beat (shown on the X-axis) which slice (shown on the Y-axis) is excited and measured. It can be recognized that two heart beats are respectively required to measure a slice according to the first conventional method 33. The slice is thereby brought into a dynamic steady state relative to its magnetization with the respective first heart beat (this phase is drawn with dashed lines and represented with the reference character 34) while the respective slice is excited in the respective following, second heart beat and the corresponding MR signals of the slice are read out (this phase is drawn with solid lines and represented with the reference character 35).

In the second conventional method 32, which likewise is shown in FIG. 2c, one slice is respectively measured per heart beat. In contrast to the first conventional method 33, the second conventional method 32 omits a preparation phase 34 in which the respective slice 1 is brought into a dynamic steady state relative to its magnetization (transformation of slice 1 into the steady state). Although this omission of the preparation phase 34 leads to an implementation time that is halved in comparison to the first conventional method 33, this is purchased with a lower quality of the imaging (in particular a lower contrast).

In contrast to this, the method 31 according to the invention measures the volume segment or the heart chamber 22 quasi-continuously, as is shown in FIG. 2b, wherein successive slices respectively significantly overlap. The method 31 according to the invention thereby begins with a first slice at the lower edge of the volume segment 22, wherein this first slice is brought into a dynamic stead state relative to its magnetization via the method according to the invention before the actual measurement process begins. The slice is subsequently excited by means of the magnetic resonance system and the MR signals of the slice are read out.

The slice 1 is subsequently shifted slightly by 0.5 mm upward in the direction of the normal vector of the slice area before the displaced slice 1 is excited and the MR signals of the slice 1 are read out. The shifted slice is thereby not brought into a dynamic steady state relative to its magnetization. A displacement by 0.5 mm given a slice thickness of 8 mm means that a section region between the slice before the displacement and the slice after the displacement comprises nearly 94% of the slice thickness, or that (in other words) the slice is shifted by 6% of the slice thickness. The method according to the invention does not have to implement the step for transformation of the slice into the dynamic steady state relative to its magnetization (as is typical according to the prior art), and nor is the method according to the invention bound to the cycle of the heart beats, which is why the method according to the invention can measure significantly more slices per time unit than typical methods according to the prior art. A savings potential of a factor of two with regard to the measurement time results for the method according to the invention solely by omitting the transformation of the slice into the dynamic steady state relative to its magnetization before every excitation and acquisition of the MR signals of the slice.

Moreover, the method 31 according to the invention measures the entire volume segment without gaps while the methods 32, 33 according to the prior art leave a 1 cm-large interstice between two adjacent slices 1, such that no measurement values exist or are acquired for these interstices or gaps. Expressed in a different way, the spatial resolution of the imaging according to the invention is significantly higher than given methods according to the prior art.

Figure 3:
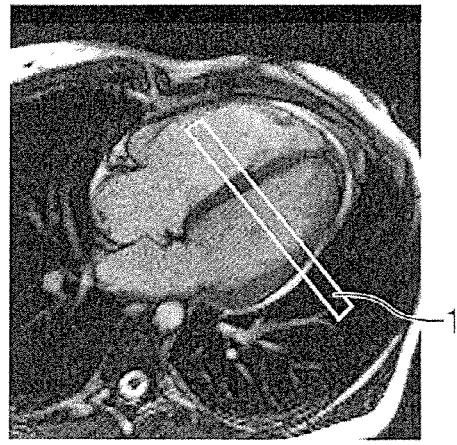
FIGS. 3 and 4 show a section of a user interface for the implementation of the method according to the invention.
Figure 4:
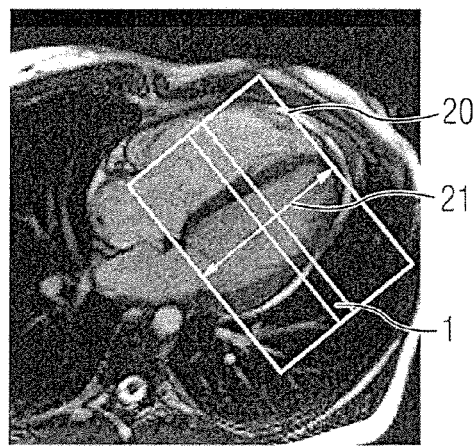

Sections of a user interface for implementation of the method according to the invention are shown in FIGS. 3 and 4, wherein the following workflow according to the invention is executed:

Plan or, respectively, place a slice in the middle of the volume segment to be determined or subject to be measured, perpendicular to the shortest axis of the volume segment to be determined or subject to be measured. The shortest axis corresponding to the shortest edge in a cuboidal volume segment, for example.

Determine the total volume segment so that the volume segment nearly completely contains the subject to be measured.

Implement the method according to the invention for imaging of the volume segment.

In FIG. 3 a user places a slice 1 in the middle of a volume segment to be measured. The thickness of the volume segment in the direction of the normal vector 21 of the slice 1 is then determined automatically such that the subject to be examined (in the present case a heart chamber) lies entirely within the volume segment 20.

The offset length can then be determined via Equation (1) (described above) from the volume segment thickness that is so determined, the available total measurement time and the known readout time period per measurement.

It is noted that the slice shown in FIG. 4 is not the first slice 1 which is excited by the method according to the invention. The first slice 1 which is excited by the method according to the invention lies at the oblique upper (or oblique lower) edge of the volume segment 20 in the direction of the normal vector 21, such that the entire volume segment 20 can be measured from there in that the slices 1 are shifted downward at an angle (or upward at an angle), measurement for measurement, until the entire volume segment 20 has been measured.

Although modifications and changes may be suggested by those skilled in the art, it is the intention of the inventors to embody within the patent warranted hereon all changes and modifications as reasonably and properly come within the scope of his contribution to the art.

We claim as our invention:

1. A magnetic resonance method for imaging a volume segment of a subject, comprising the steps of:
    with a magnetic resonance data acquisition unit that interacts with a subject, imposing a magnetization in a volume segment of the subject and transforming a slice of the volume segment into a dynamic steady state relative to said magnetization;
    after transforming said slice, acquiring magnetic resonance data from the volume segment in a plurality of repetitions and, in each repetition, exciting nuclear spins in the slice to cause said nuclear spins to emit magnetic resonance signals, reading out said magnetic resonance signals from said slice and offsetting said slice with an overlap with respect to a preceding repetition, with an overlap range comprising a predetermined percentile of said slice before offsetting said slice and after offsetting said slice; and
    repeating said repetitions until magnetic resonance data has been completely acquired from all of said volume segment.

2. A method as claimed in claim 1 comprising employing a predetermined percentile that is greater than 50%.

3. A method as claimed in claim 1 wherein said slice has a slice surface with a normal vector relative thereto, and offsetting said slice in a direction of said normal vector.

4. A method as claimed in claim 1 comprising transforming said slice into said dynamic steady state relative to said magnetization only at a beginning of magnetic resonance data acquisition from said slice.

5. A method as claimed in claim 1 wherein the subject is a living being, and comprising defining said volume segment to encompass at least a portion of the heart of the living being.

6. A method as claimed in claim 5 comprising reconstructing an image of the heart of the living being from said magnetic resonance signals read out from said slice by processing said magnetic resonance signals with a model-based ventricle analysis.

7. A method as claimed in claim 1 comprising reconstructing a plurality of images from said magnetic resonance signals to generate a real-time cine presentation.

8. A method as claimed in claim 1 wherein said slice has a slice surface with a normal vector, and comprising offsetting said slice between any successive two of said repetitions by an offset length calculated as a product of thickness of a said volume segment in a direction of said normal vector, and a quotient of a time duration required to read out the magnetic resonance signals from the slice and a total measurement time for acquiring said magnetic resonance data from an entirety of said volume segment.

9. A method as claimed in claim 1 comprising reading out magnetic resonance signals from said slice for obtaining an image of an entirety of said slice.

10. A control device for imaging a volume segment of a subject, comprising the steps of:
    an operating unit configured to a magnetic resonance data acquisition unit that interacts with a subject, to impose a magnetization in a volume segment of the subject and to transform a slice of the volume segment into a dynamic steady state relative to said magnetization;
    said operating unit being configured to operate said data acquisition unit, after transforming said slice, to acquire magnetic resonance data from the volume segment in a plurality of repetitions and, in each repetition, excite nuclear spins in the slice to cause said nuclear spins to emit magnetic resonance signals, to read out said magnetic resonance signals from said slice and to offset said slice with an overlap with respect to a preceding repetition, with an overlap range comprising a predetermined percentile of said slice before offsetting said slice and after offsetting said slice; and
    said operating unit being configured to operate said data acquisition unit to repeat said repetitions until magnetic resonance data has been completely acquired from all of said volume segment.

11. A control device as claimed in claim 10 wherein said operating unit is configured to employ a predetermined percentile that is greater than 50%.

12. A control device as claimed in claim 10 wherein said slice has a slice surface with a normal vector relative thereto, and wherein said operating unit is configured to operate said data acquisition unit to offsetting said slice in a direction of said normal vector.

13. A control device as claimed in claim 10 wherein said operating unit is configured to operate said data acquisition unit to transform said slice into said dynamic steady state relative to said magnetization only at a beginning of magnetic resonance data acquisition from said slice.

14. A control device as claimed in claim 10 wherein the subject is a living being, and wherein said operating unit is configured to operate said data acquisition unit to define said volume segment to encompass at least a portion of the heart of the living being.

15. A control device as claimed in claim 14 comprising an evaluation unit configured to reconstruct an image of the heart of the living being from said magnetic resonance signals read out from said slice by processing said magnetic resonance signals with a model-based ventricle analysis.

16. A control device as claimed in claim 10 wherein said evaluation unit is configured to reconstruct a plurality of images from said magnetic resonance signals to generate a real-time cine presentation.

17. A control device as claimed in claim 10 wherein said slice has a slice surface with a normal vector, and wherein said operating unit is configured to operate said data acquisition unit to offset said slice between any successive two of said repetitions by an offset length calculated as a product of thickness of a said volume segment in a direction of said normal vector, and a quotient of a time duration required to read out the magnetic resonance signals from the slice and a total measurement time for acquiring said magnetic resonance data from an entirety of said volume segment.

18. A control device as claimed in claim 10 wherein said operating unit is configured to operate said data acquisition unit to read out magnetic resonance signals from said slice for obtaining an image of an entirety of said slice.

19. A magnetic resonance system for imaging a volume segment of a subject, comprising:
   a magnetic resonance data acquisition unit that interacts with a subject;
   an operating unit configured to operate said data acquisition unit to impose a magnetization in a volume segment of the subject and transform a slice of the volume segment into a dynamic steady state relative to said magnetization;
   said operating unit being configured to operate said data acquisition unit, after transforming said slice, to acquire magnetic resonance data from the volume segment in a plurality of repetitions and, in each repetition, to excite nuclear spins in the slice to cause said nuclear spins to emit magnetic resonance signals, to read out said magnetic resonance signals from said slice and to offset said slice with an overlap with respect to a preceding repetition, with an overlap range comprising a predetermined percentile of said slice before offsetting said slice and after offsetting said slice; and
   said operating unit being configured to operate said data acquisition unit to repeat said repetitions until magnetic resonance data has been completely acquired from all of said volume segment.

20. A non-transitory computer-readable medium encoded with programming instructions and being loaded into a computerized control system of a magnetic resonance apparatus having a magnetic resonance data acquisition unit that interacts with a subject, said programming instructions causing said computerized control system to:
   operate a magnetic resonance data acquisition unit that interacts with a subject to impose a magnetization in a volume segment of the subject and transform a slice of the volume segment into a dynamic steady state relative to said magnetization;
   operate said data acquisition unit after transforming said slice, to acquire magnetic resonance data from the volume segment in a plurality of repetitions and, in each repetition, excite nuclear spins in the slice to cause said nuclear spins to emit magnetic resonance signals, read out said magnetic resonance signals from said slice and offset said slice with an overlap with respect to a preceding repetition, with an overlap range comprising a predetermined percentile of said slice before offsetting said slice and after offsetting said slice; and
   operate said data acquisition unit to repeat said repetitions until magnetic resonance data has been completely acquired from all of said volume segment.

* * * * *